United States Patent [19]

Mullaney, Jr.

[11] Patent Number: 4,911,811

[45] Date of Patent: Mar. 27, 1990

[54] METHOD OF MAKING COATED ARTICLES WITH METALLIC APPEARANCE

[75] Inventor: Richard L. Mullaney, Jr., Bristol, Conn.

[73] Assignee: The Stanley Works, New Britain, Conn.

[21] Appl. No.: 219,073

[22] Filed: Jul. 14, 1988

[51] Int. Cl.⁴ .................... C23C 14/20; C23C 14/34
[52] U.S. Cl. .................... 204/192.14; 427/404; 427/407.1; 427/409; 428/622; 428/624; 428/626; 428/216
[58] Field of Search .................. 204/192.14, 192.15, 204/192.16, 192.27; 427/13, 250, 404, 407.1, 409; 428/216, 622, 624, 626

[56] References Cited

U.S. PATENT DOCUMENTS

| | | | |
|---|---|---|---|
| 3,170,833 | 2/1965 | Noyes | 428/416 |
| 3,660,138 | 5/1972 | Gorrell | 428/425.8 X |
| 3,740,254 | 6/1973 | Lansbury et al. | 428/423.7 |
| 3,984,907 | 10/1976 | Vossen, Jr. | 204/192.14 X |
| 4,101,698 | 7/1978 | Dunning et al. | 428/425.8 X |
| 4,131,530 | 12/1978 | Blum | 204/192.14 |
| 4,148,967 | 4/1979 | Satoh et al. | 428/416 |
| 4,268,570 | 5/1981 | Imanaka et al. | 428/216 |
| 4,305,981 | 12/1981 | Muroi et al. | 428/425.8 |
| 4,310,587 | 1/1982 | Beaupre | 428/246 |
| 4,340,646 | 7/1982 | Ohno et al. | 428/429 |
| 4,369,225 | 1/1983 | Manabe et al. | 428/334 |
| 4,374,717 | 2/1983 | Drauglis et al. | 204/192.14 |
| 4,393,120 | 7/1983 | Watai et al. | 428/457 |

FOREIGN PATENT DOCUMENTS 1190480  5/1970  United Kingdom .

*Primary Examiner*—Aaron Weisstuch

[57] ABSTRACT

A decorative and protective coating is provided on articles by a composite of a dry metallized layer on the substrate, a substantially transparent base coating of a synthetic resin formulation, a decorative metal layer hereon and a substantially transparent top coating of a synthetic resin formulation. As a result, the metallic layer is visible through the top coating to provide the desired metallic appearance, and the thin metallic deposit on the surface of the substrate is visible through both of the resin coatings in the event that the continuity of the metallic layer is ruptured during use. The coatings are produced by dry metallizing the surface of the article to provide the thin metallic deposit, electrostatically spraying the base coating thereon and thereafter curing the coating. Dry metallizing the base coating to provide the decorative metallic layer and then depositing the top coating thereon and effecting its curing.

15 Claims, 2 Drawing Sheets

METHOD OF MAKING COATED ARTICLES WITH METALLIC APPEARANCE

BACKGROUND OF THE INVENTION

The present invention relates to decorative and protective coatings for articles and which provide a desirable metallic appearance.

Decorative and protective coatings are widely employed on various articles and may be applied by various techniques. On metal articles, electroplating has been extensively utilized to provide chromium, zinc and brass plated surfaces which provide coatings which are both protective and decorative. In some instances, these electroplated coatings are chemically treated to enhance their corrosion and/or chemical resistance and/or to provide decorative finishes. In other instances, a clear lacquer or resin coating is applied. In some applications, colored organic coatings are applied directly to the substrate.

With synthetic resin articles, electroplating cannot be employed without first developing a conductive surface. Thus, chemical or electroless plating and vacuum metallizing are widely employed; however, development of a deposit of sufficient thickness to provide good protective coating is slow and expensive so that electroplating is frequently employed as a second step. Metal-filled organic resin coatings also are sometimes employed to provide a metallic appearance.

The techniques for applying organic coatings are varied, but spray applications predominate in usage. Such spray techniques can be quite inefficient because a substantial portion of the sprayed composition will not deposit on the article or will deposit unevenly. With articles having a conductive surface, electrostatic spray techniques greatly improve the efficiency of the coating operation.

It is an object of the present invention to provide a novel method for developing coatings with highly desirable metallic appearance at relatively low cost.

It is also an object to provide such a method which is applicable to both metallic and non-metallic substrates.

Another object is to provide such a method in which the coating exhibits good wear resistance and substantive uniformity of coloration.

SUMMARY OF THE INVENTION

It has now been found that the foregoing and related objects and advantages may be readily attained in a method for producing decorative and protective coatings on articles in which a surface of the article is subjected to a process of dry vacuum metallization to develop a thin metallic deposit thereon of about 100–500 Angstroms in thickness, and electrostatically sprayed onto this metallic deposit is a base coating of a substantially transparent resin formulation. This coating is cured to form a substantially transparent layer of about 0.0005–0.0015 inch in thickness.

The surface of the transparent layer is then subjected to a process of dry vacuum metallization to develop a thin decorative metallic layer thereon of about 100–5000 Angstroms in thickness. A top coating of a substantially transparent resin formulation is applied onto the decorative metal layer, and this top coating is cured to provide a substantially transparent layer having of a thickness of about 0.0005–0.0020 inch. The metallic deposit and several layers produce a composite coating providing a decorative metallic appearance for the article and affording high resistance to corrosion, chemical attack and abrasion.

Generally, the articles utilized in this process are fabricated from synthetic resin although metallic articles and ceramic articles may also be employed.

Desirably, the surface of the article is initially subjected to a cleaning step, and the coatings are provided by resins selected from the group consisting of urethanes, acrylics, urethane-modified acrylics and acrylic-modified urethanes, and copolymers and mixtures thereof. Preferably, the base and top coatings are subjected to ultraviolet radiation to effect curing, and desirably they are initially subjected to infrared radiation to flash off volatiles prior to exposure to ultraviolet radiation. In the preferred process, the top coating is applied by electrostatic spraying to effect a substantially uniform thickness in the top layer.

Normally, the article is one having a multiplicity of surfaces extending at angles to each other and intersecting, and the composite coating is of substantially uniform thickness and coloration over the multiplicity of surfaces and the intersections thereof.

Most desirably, the process of vacuum dry metallizing is effected by sputter coating, and the metal is the same in both the metallic deposit and the metallic layer.

When the article is fabricated from synthetic resin, it is, as coated, free from thermal distortion. When the metal of the metallic deposit is the same as that of the metallic layer, the metallic deposit is visible through both of the coatings and, in the event of a discontinuity in the metallic layer, it maintains the uniformity of the metallic appearance.

DETAILED DESCRIPTION OF THE ILLUSTRATED EMBODIMENT

Figure 1:
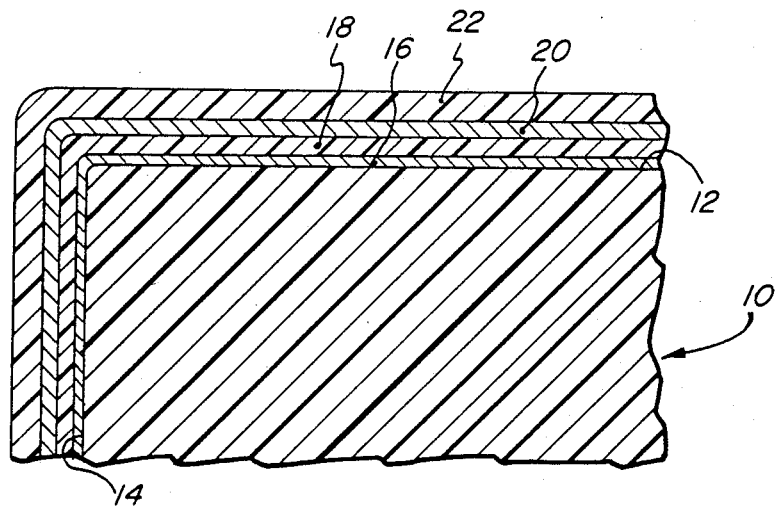
FIG. 1 is a fragmentary diagrammatic view of an article employing a coating produced in accordance with the present invention and drawn to an enlarged scale.

Turning in detail first to FIG. 1 of the attached drawing, therein diagrammatically illustrated is a portion of an article generally indicated by the numeral 10 having surfaces 12 and 14 which extend at angles to each other and intersect along an edge. Disposed upon the surfaces 12 and 14 is a composite coating embodying the present invention which includes a thin metallic deposit 16 directly upon the surfaces of the article 10, and a base coat 18 of a transparent resin formulation thereon. Superimposed upon the base coat 18 is a decorative metallic layer 20 which is generally of greater thickness than the metallic deposit 16, and the top coat 22 of a substantially transparent synthetic resin formulation is disposed thereon to complete the composite coating. The thicknesses of the metallic layers are exaggerated relative to the thickness of the resin coatings for clarity of illustration.

Figure 2:
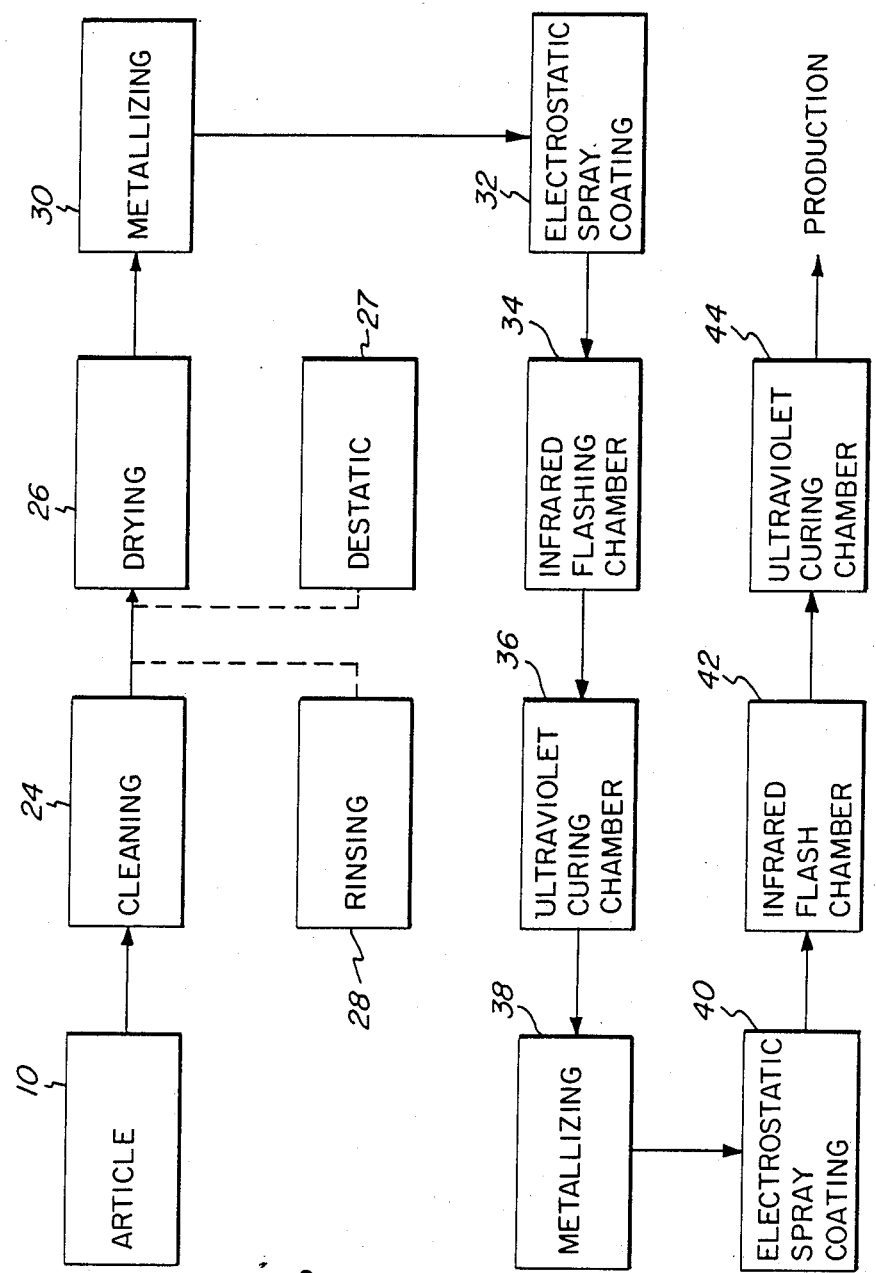
FIG. 2 is a diagrammatic illustration of the steps in a process embodying the present invention.

Turning now to FIG. 2, therein illustrated diagrammatically are the several steps of the process for producing the composite coatings of the present invention. The article 10 is initially subjected to a cleaning step 24 to remove contamination from its surface and which may incidentally effect some etching of the surface to improve the adhesion of the metal deposit. Following the cleaning step there is desirably a drying step 26, which is particularly necessary if an optional wet cleaning process is employed which will usually require a rinsing step 28. A destatic treatment 27 is also desirably employed.

In the next essential step, the article is introduced into a sputter coating chamber 30 in which a thin metallic deposit is provided over the entire exposed surface. The article 10 is then transported to an electrostatic spray coating apparatus designated by the numeral 32 in which a base coat of a transparent resin formulation is applied thereto. The coated articles are then passed through a chamber 34 in which they are exposed for a short period of time to infrared radiation to flash off the volatiles from the deposited coating, and then they are moved into a curing chamber 36 in which they exposed to ultraviolet light for a short period of time to produce the cross linking and curing of the coating.

The articles are then transported into a sputter coating apparatus 38 in which the decorative metallic layer is deposited thereon, after which they are moved into a electrostatic spray coating apparatus designated by the numeral 40 in which the top coat is sprayed thereon. As in the instance of the base coat, the coated articles are moved through a chamber 42 in which they are exposed to infrared radiation to remove volatiles, and then into a curing chamber 44 in which they are exposed to ultraviolet radiation to effect cross linking and curing of the top coating.

Upon removal from the UV curing chamber 44, the articles may be moved to assembly lines or other processing stations.

As indicated previously, the metallic deposits are effected by a dry vacuum metallization process. Although conventional vacuum metallizing may be utilized, sputter coating has been found particularly effective in that it is relatively low cost, avoids thermal distortion, requires minimum time and enables the deposition not only of elemental metals but also alloys such as brass. To minimize the deposition of metal upon surface areas which do not require the composite coating (e.g., inside surfaces), racks and jigs of various configurations may be employed to function as masks in the metallizing process.

The cleaning step is most conveniently effected by a solvent vapor process to minimize the need for or amount of, subsequent drying and to eliminate the need for rinsing. However, immersion in solvents and detergent solutions may also be employed so long as the surfaces of the articles are rinsed and thoroughly dried prior to the deposition of metal thereon.

Although not essential, it has been found desirable to remove dust and other particles which may adhere to the surfaces by electrostatic attraction. A device that provides an electrostatic field or pressurized air may conveniently be employed for this purpose.

The articles which are coated in the process of the present invention may be fabricated from synthetic resins, metal or ceramics. However, the process is most advantageous in the processing of synthetic resin articles.

The nature of the metals to be deposited upon the surface of the article will depend upon the desired metallic appearance. Elemental metals may be utilized to present the appearance customarily associated therewith, such as aluminum, silver, gold, copper, chromium, nickel, and alloys thereof. When sputter coating is employed, metal alloys may be deposited to present the metallic appearance customarily associated with those alloys, i.e., brass and stainless steel. Thus, the process enables a wide choice of metallic finishes.

Although the initial metallic deposit and the decorative metallic layer will normally utilize the same metal (or alloy), it is possible that two different metals could be employed for special properties, or for special appearance effects by masking during the two steps.

The resin formulations employed with the greatest efficacy are systems which use organic solvents; however, water-based systems may also be employed albeit with the likelihood of greater processing times because of the slower drying and curing steps. The resin formulations preferably utilize resins which cross link upon exposure to ultraviolet light so as to provide highly durable surfaces which are resistant to corrosion, chemicals and abrasion. However, curing by heat exposure or aging may also be employed. The preferred resin systems are acrylic or urethane-based systems and include acrylics, urethanes, acrylic-modified urethanes, urethane modified-acrylics, and copolymers, and mixtures thereof.

Although the resin formulations are intended to produce transparent coatings, they may be tinted with dyes to vary the coloration of the metallic appearance.

After application of the coatings, they are desirably passed through a solvent flash-off chamber in which they are exposed to infrared radiation for a relatively short period of time to avoid any thermal distortion of the articles. This will normally involve exposure for 10–60 seconds at temperatures most usually of 110°–175° Fahrenheit in the environment adjacent the articles for conventional resins.

Following the solvent flash off, the coatings are then exposed to the ultraviolet radiation for a relatively short period of time to effect the desired cross linking and curing of the coating. This will normally require a period of 30–150 seconds depending upon the geometry of the article, the intensity of the ultraviolet radiation in the chamber, and the nature of the coating.

The initial metallic deposit should have a thickness within the range of 100–500 Angstroms, and preferably is in the range of 150–300 Angstroms. The thickness of the decorative metal layer should be within the range of 100–5000 Angstroms and preferably within the range of 300–700 Angstroms, although greater thicknesses may be employed albeit at greater processing time and cost.

The cured base coat of transparent resin should have a thickness of at least 0.005 inch and may range up to 0.0015 inch, and even more. However, thicknesses in excess of 0.008 inch increase the cure time and provide little added benefit so that the preferred thickness is generally in the range of 0.0005–0.008 inch.

The top coat should be of greater thickness to provide the desired abrasion resistance and resistance to corrosion and chemicals and will normally fall within the range of 0.0005–0.0020 inch and preferably within the range of 0.0012–0.0015 inch, although greater thickness may be employed if so desired.

Electrostatic spray coating is utilized for the base coat to ensure a relatively smooth deposit of uniform thickness. In addition, it minimizes the amount of resin required. Although other types of coating may be employed for the top coat, electrostatic spraying is preferable for the above reasons.

It has been found that a composite coating having a total thickness within the range of 0.0015–0.0045 inch is generally quite satisfactory. Preferably the composite coating thicknesses are within the range of 0.0018–0.0025 inch for optimum cost/performance benefit.

The types of articles which may be coated in accordance with the process of the present invention may vary widely. Plastic cases and handles of various configurations for hand and power tools have been processed readily to provide attractive products at relatively low cost. Metal hinges have been so coated as an alternate to conventional electroplating.

As will be appreciated, the initial metallic deposit renders the base surface conductive for the coating process and permits electrostatic spray deposition of the base coating of transparent resin. Since it usually is of the same metal as in the decorative metallic layer, it will provide the desired metallic appearance in the event of a discontinuity in the decorative metallic layer. Because of the diffusion characteristics of the vacuum deposition process, it provides a good bond for the composite coating and it smooths the surface.

Illustrative of the efficacy of the present invention are the following specific examples:

EXAMPLE ONE

Measuring tape rule cases fabricated from ABS resin comprising interfitting half sections of generally U-shaped cross-section and each having an outer surface area of about 26 square inches were mounted on reel-type racks which are rotatable. The racks with the cases thereon were placed in a solvent vapor cleaning chamber in which the cases were exposed to vapor comprising a mixture of solvents containing 92% trichlorotrifluoroethane, 2% ethyl alcohol, 1% nitromethane, 1% isopropyl alcohol and 4% methyl alcohol for a period of approximately four minutes. The racks were then introduced into a drying area in which the articles were heated by infrared radiation for 1 minute to ensure dryness of the surface.

The racks were then advanced into a sputter coating chamber in which an initial deposit of Type 304 stainless steel was developed in a sputter time of 60 seconds. Upon examination, the metallic deposit over the outer surfaces of the case halves was found to have a thickness of approximately 200 Angstroms.

The racks were then moved into an electrostatic spray booth in which the articles were electrostatically sprayed with an acrylic-modified urethane coating composition sold by PPG Industries, Inc., under the designation R480Z73. This composition was thinned to a viscosity of 17 seconds using a Zahn 2 cup. Following electrostatic spraying, the racks were moved into a gas thermal reactor chamber in which the articles were exposed to infrared radiation for a period of 45 seconds to remove the volatiles from the coating. The racks were then moved into a ultraviolet curing chamber in which the articles were exposed to ultraviolet radiation for a period of 73 seconds. This was found to produce cross linking and full curing of the coating, and, upon examination, the dried coating was found to have a thickness of 0.00080 inch.

The racks were then moved into a second sputter coating chamber in which the articles were sputter coated with Type 304 stainless steel alloy for a period of 120 seconds to produce a coating with a thickness of approximately 500 Angstroms.

The racks were then moved into an electrostatic spray coating chamber in which the same resin formulation was electrostatically sprayed onto the articles. The racks with the coated articles were then moved through a gas thermal reactor chamber and a UV curing chamber in the same fashion as the earlier steps. The cured top coating had a thickness of 0.00150 inch.

Upon removal from the racks, visual inspection indicated high specular brightness and uniform coloration. Testing in a Hunter Labscan CIE L,a,b apparatus showed uniformity of coloration and a color matching electroplated chromium.

The coatings were found to have high resistance to abrasion as evidenced by 3000 cycles in a Taber abrasion resistance test using a 500 gm. weight and CS-10 wheels.

The corrosion resistance was also found to be excellent. No failure was detected at 400 hours in a salt spray test. In a solvent spray test using copper acetic acid solvent spray, no failure was detected in 22 hours.

Cases exposed to constant humidity of 95% relative humidity showed no failure at 280 hours. Water immersion for 100 hours also produced no failures.

Testing of the stability of the coating in ultraviolet light indicated no failure at 125 hours; and no failure was detected at 125 hours in the weatherometer.

Immersion in a series of solvents and chemicals, (alcohol, fuel oil, gasoline, kerosene, detergent, machine oil and turpentine) produced no failure.

No failures were found upon thermal cycling of coated cases involving three cycles each of (i) initial exposure to a temperature of −20° F. for one hour, (ii) a fifteen minute rest period at room temperature, (iii) exposure to 180° F. for a period of one hour, and (iv) fifteen minutes rest period at room temperature.

Thus, the coatings were found to provide the desired high quality decorative metallic appearance, and high resistance to corrosion, chemical, and abrasion.

EXAMPLE TWO

The process of Example One was substantially repeated but substituting brass alloy (60/40) as the metal being deposited by the sputter coating process on the measuring rule case halves.

Upon inspection in the Hunter Labscan, the coating was found to replicate the coloration of conventional brass. Testing of the coatings for corrosion, solvent and chemical resistance, and for abrasion resistance, similarly produced highly desirable results.

Thus, it can be seen from the foregoing detailed specification that the process of the present invention produces composite coatings upon articles so as to provide a highly desirable metallic appearance and good protection for the articles themselves. The process for developing such coatings is relatively rapid, simple and economical and may be very easily modified to change the nature of the metallic appearance.

Having thus described the invention, what is claimed is:

1. In a method for producing decorative and protective coatings on articles, the steps comprising:
   (a) subjecting a surface of an article to a process of dry vacuum metallization to develop a thin metallic deposit thereon of about 100–500 Angstroms in thickness;
   (b) electrostatically spraying onto said metallic deposit a base coating of a substantially transparent resin formulation;
   (c) curing said coating to form a substantially transparent layer of about 0.0005–0.0015 inch in thickness;

(d) subjecting the surface of said transparent layer to a process of dry vacuum metallization to develop a thin decorative metallic layer thereon of about 100-5000 Angstroms in thickness;

(e) applying onto said decorative metal layer a top coating of a substantially transparent resin formulation; and (f) curing said top coating to provide a substantially transparent layer having a thickness of about 0.0005-0.0020 inch, said metallic deposit and layers producing a composite coating providing a decorative metallic appearance to said article and affording high resistance to corrosion, chemical attack and abrasion.

2. The method of producing decorative and productive coatings in accordance with claim 1 wherein said article is fabricated from synthetic resin.

3. The method of producing decorative and protective coatings in accordance with claim 1 wherein said surface of said article is initially subjected to a cleaning step.

4. The method of producing decorative and protective coatings in accordance with claim 1 wherein said coatings are provided by resins selected from the group consisting of urethanes, acrylics, urethane-modified acrylics and acrylic-modified urethanes, and copolymers and mixtures thereof.

5. The method of producing decorative and protective coatings in accordance with claim 4 wherein said base and top coatings are subjected to ultraviolet radiation to effect curing.

6. The method of producing decorative and protective coatings in accordance with claim 5 wherein said coatings are initially subjected to infrared radiation to flash off volatiles prior to exposure to ultraviolet radiation.

7. The method of producing decorative and protective coatings in accordance with claim 4 wherein said top coating is applied by electrostatic spraying.

8. The method of producing decorative and protective coatings in accordance with claim 1 wherein said article is one having a multiplicity of surfaces extending at angles to each other and intersecting, and wherein said composite coating is of substantially uniform thickness and coloration over said multiplicity of surfaces and the intersections thereof.

9. The method of producing and decorative coatings in accordance with claim 1 wherein said process of vacuum dry metallizing is effected by sputter coating.

10. The method of producing and decorative coatings in accordance with claim 1 wherein the metal of said deposit and of said metallic layer is the same.

11. In a method for producing decorative and protective coatings on articles, the steps comprising:

(a) subjecting an article formed from synthetic resin and having a multiplicity of surfaces extending at angles to each other which intersect to a process of dry vacuum metallization to develop a thin metallic deposit thereon of about 100-500 Angstroms in thickness;

(b) electrostatically spraying onto said metallic deposit a base coating of a substantially transparent resin formulation selected from the group consisting of urethanes, acrylics, urethane-modified acrylics and acrylic-modified urethanes, and copolymers and mixtures thereof;

(c) curing said coating to form a substantially transparent layer of about 0.0005-0.0015 inch in thickness;

(d) subjecting the surface of said transparent layer to a process of dry vacuum metallization to develop a thin decorative metallic layer thereon of about 100-5000 Angstroms in thickness, the metal of said deposit and of said metallic layer being the same;

(e) electrostatically spraying onto said decorative metal layer a top coating of substantially the same transparent resin formulation; and (f) curing said top coating to provide a substantially transparent layer having a substantially uniform thickness of about 0.0005-0.0020 inch, said composite coating being of substantially uniform thickness and coloration over said multiplicity of surfaces and the intersections thereof, said metallic deposit and layers producing a composite coating providing a decorative metallic appearance to said article and affording high resistance to corrosion, chemical attack and abrasion.

12. The method of producing decorative and protective coatings in accordance with claim 11 wherein said surface of said article is initially subjected to a cleaning step.

13. The method of producing decorative and protective coatings in accordance with claim 11 wherein said base and top coatings are subjected to ultraviolet radiation to effect curing.

14. The method of producing decorative and protective coatings in accordance with claim 13 wherein said coatings are initially subjected to infrared radiation to flash off volatiles prior to exposure to ultraviolet radiation.

15. The method of producing and decorative coatings in accordance with claim 11 wherein said process of vacuum dry metallizing is effected by sputter coating.

* * * * *

UNITED STATES PATENT AND TRADEMARK OFFICE
CERTIFICATE OF CORRECTION

PATENT NO. : 4,911,811

DATED : March 27, 1990

INVENTOR(S) : Richard L. Mullaney, Jr.

It is certified that error appears in the above-identified patent and that said Letters Patent is hereby corrected as shown below:

Column 4, line 49, delete "0.005" and insert --0.0005--;
line 51, delete "0.008" and insert --0.0008--;
delete "0.008" and insert --0.0008--.

Signed and Sealed this

Twenty-fifth Day of February, 1992

Attest:

HARRY F. MANBECK, JR.

*Attesting Officer*  *Commissioner of Patents and Trademarks*